United States Patent
Zhuang et al.

(10) Patent No.: US 8,839,020 B2
(45) Date of Patent: Sep. 16, 2014

(54) DUAL MODE CLOCK/DATA RECOVERY CIRCUIT

(75) Inventors: Jingcheng Zhuang, San Diego, CA (US); Nam V. Dang, San Diego, CA (US); Xiaohua Kong, San Diego, CA (US); Zhi Zhu, San Diego, CA (US); Tirdad Sowlati, Irvine, CA (US); Behnam Amelifard, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 309 days.

(21) Appl. No.: 13/420,800

(22) Filed: Mar. 15, 2012

(65) Prior Publication Data

US 2013/0191679 A1  Jul. 25, 2013

Related U.S. Application Data

(60) Provisional application No. 61/590,295, filed on Jan. 24, 2012.

(51) Int. Cl.

| | | |
|---|---|---|
| *G06F 1/04* | (2006.01) | |
| *G06F 1/12* | (2006.01) | |
| *H03L 7/00* | (2006.01) | |
| *H04B 7/212* | (2006.01) | |
| *H04L 12/28* | (2006.01) | |
| *H04J 3/06* | (2006.01) | |
| *H04L 7/00* | (2006.01) | |
| *H04B 1/16* | (2006.01) | |
| *G06F 15/16* | (2006.01) | |

(52) U.S. Cl.
USPC ........... 713/503; 713/400; 327/141; 370/324; 370/395.62; 370/503; 375/354; 455/208; 709/248

(58) Field of Classification Search
CPC ............................ H03L 7/0807; H04L 7/033
USPC .................. 713/400, 503; 327/141; 370/324, 370/395.62, 503; 375/354; 709/248; 455/208

See application file for complete search history.

(56) References Cited

U.S. PATENT DOCUMENTS 6,259,755 B1  7/2001  O'sullivan et al.
7,519,750 B2 *  4/2009  Scouten et al. ............... 710/100

(Continued)

FOREIGN PATENT DOCUMENTS

WO   8905065 A1   6/1989

OTHER PUBLICATIONS

International Search Report and Written Opinion—PCT/US2013/023025—ISA/EPO—Jun. 20, 2013.

*Primary Examiner* — Stefan Stoynov
(74) *Attorney, Agent, or Firm* — Sam Talpalatsky; Nicholas J. Pauley; Joseph Agusta

(57) ABSTRACT

A clock/data recovery circuit includes an edge detector circuit operable to receive a serial data burst and to generate a reset signal in response to a first edge of the serial data burst. The clock/data recovery circuit may also include an oscillator coupled to the edge detector circuit. The oscillator locks onto a target data rate prior to receipt of the serial data burst and locks onto a phase of the serial data burst in response to the reset signal. The clock/data recovery circuit may also include a phase detector circuit that receives the serial data burst. The phase detector circuit is coupled to the oscillator. The phase detector circuit adjusts the oscillator to maintain the lock onto the phase of the serial data burst during the serial data burst.

20 Claims, 7 Drawing Sheets

(56) References Cited

U.S. PATENT DOCUMENTS

| | | | |
|---|---|---|---|
| 7,733,131 B2 * | 6/2010 | Regev | 327/18 |
| 8,149,973 B2 * | 4/2012 | Fukuda et al. | 375/354 |
| 8,416,902 B2 * | 4/2013 | Kyles et al. | 375/355 |
| 8,649,473 B2 * | 2/2014 | Nishi et al. | 375/354 |
| 2007/0081619 A1 | 4/2007 | Kuo et al. | |
| 2009/0041104 A1 | 2/2009 | Bogdan | |

* cited by examiner

DUAL MODE CLOCK/DATA RECOVERY CIRCUIT

CROSS-REFERENCE TO RELATED APPLICATION

This application claims the benefit under 35 U.S.C. §119 (e) to U.S. Provisional Patent Application No. 61/590,295 entitled, DUAL MODE CLOCK/DATA RECOVERY CIRCUIT, filed on Jan. 24, 2012, in the names of ZHUANG, et al., the disclosure of which is expressly incorporated by reference herein in its entirety.

TECHNICAL FIELD

The present disclosure relates generally to serial data transmission. More specifically, the disclosure relates to a dual mode clock/data recovery circuit.

BACKGROUND

Several emerging data transmission standards, such as MPHY by Mobile Industry Processor Interface (MIPI), Serial Advanced Technology Attachment (SATA), Universal Serial Bus (USB) 3.0 and 5.0, Peripheral Component Interconnect (PCI) Express, 1 GB and 10 GB Ethernet, RapidIO, and Fiber Channel, have serial data transmission as their core technology. Recently, serial data transmission has become capable of delivering data transmission speeds in the range of 2-10 Gbps. Additionally, serial interfaces provide higher clock rates than other interfaces.

High-speed burst-mode serial links, such as M-PHY, have gained increasing interest in recent years. High-speed burst-mode serial links provide high power efficiency because the high-speed burst-mode serial links only enable a transmitter/receiver during a serial data burst. Unlike the continuous operation mode serial links, in high-speed burst-mode serial links the clock/data recovery (CDR) module has to promptly lock the data bits and the clock during the serial data burst. Conventional clock/data recovery (CDR) implementations, however, suffer from performance degradation due to reduced jitter tolerance.

Conventional clock/data recovery circuits also suffer from an increased start-up delay following a power down or standby of a receiver device. When everything is powered down, starting up and getting into a ready mode for transmission or reception state is time consuming. This time delay may be due to the process of locking and synchronizing the clocks as high-speed data communications solutions specify that the clocks are stable before reliable transmission.

SUMMARY

According to one aspect of the present disclosure, a dual mode clock/data recovery circuit is described. The clock/data recovery circuit includes an edge detector circuit operable to receive a serial data burst and to generate a reset signal in response to a first edge of the serial data burst. The clock/data recovery circuit may also include an oscillator coupled to the edge detector circuit. The oscillator locks onto a target data rate prior to receipt of the serial data burst and locks onto a phase of the serial data burst in response to the reset signal. The clock/data recovery circuit may also include a phase detector circuit that receives the serial data burst. The phase detector circuit is coupled to the oscillator. The phase detector circuit adjusts the oscillator to maintain the lock onto the phase of the serial data burst during the serial data burst.

According to another aspect of the present disclosure, a method within a dual mode clock/data recovery circuit is described. The method includes locking onto a target data rate prior to detecting receipt of a serial data burst. The method may also include resetting a phase in response to detecting a first edge of the serial data burst. The method further includes maintaining the lock onto the phase of the serial data burst during the burst of the serial data.

According to one aspect of the present disclosure, a dual mode clock/data recovery circuit is described. The clock/data recovery circuit includes means for locking onto a target data rate prior to receipt of a serial data burst. The clock/data recovery circuit may also include means for detecting a first edge of the serial data burst. The clock/data recovery circuit may also include means for locking onto a phase of the serial data burst in response to the detecting. The clock/data recovery circuit may further include means for maintaining the lock onto the phase of the serial data burst during the serial data burst.

According to another aspect of the present disclosure, a method within a dual mode clock/data recovery circuit is described. The method includes the step of locking onto a target data rate prior to detecting receipt of a serial data burst. The method may also include the step of resetting a phase in response to detecting a first edge of the serial data burst. The method may also include the step of maintaining the lock onto the phase of the serial data burst during the burst of the serial data.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

Figure 1:
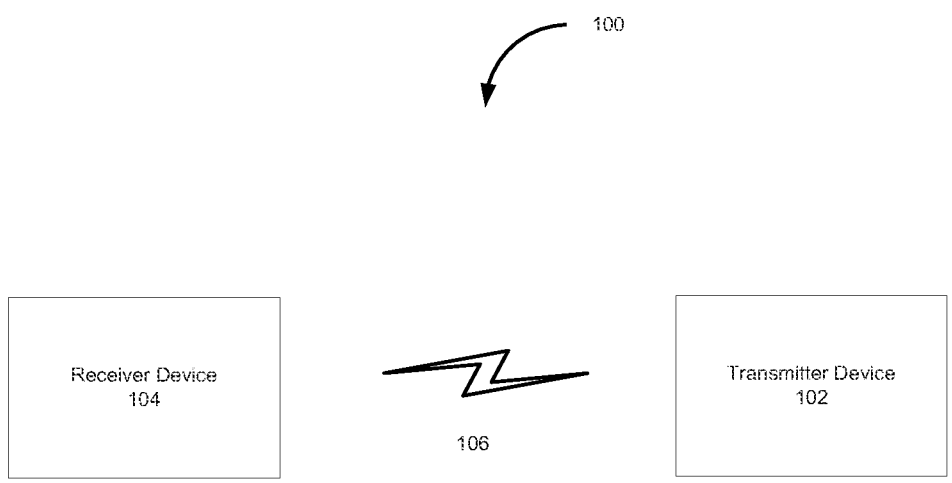
FIG. 1 is a block diagram illustrating a serial communication system, which transmits data bits sequentially over a communication channel.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

One aspect of the disclosure describes a dual mode clock/data recovery technique for serial communication. The dual mode clock/data recovery technique may conform to any number of serial interface protocols or transmission standards, such as M-PHY by Mobile Industry Processor Interface (MIPI), Serial AT Attachment (SATA), Universal Serial Bus (USB) 3.0 or 5.0, Peripheral Component Interconnect (PCI) Express, 1 GB and 10 GB Ethernet, RapidIO, Fiber Channel, and other like serial interface protocols. For clarity, the dual mode clock/data recovery technique is specifically described below with reference to the M-PHY specification.

One aspect of the disclosure includes a dual mode clock/data recovery circuit. In a burst operation mode, the clock/data recovery circuit incorporates a fast locking, implementation that reduces performance degradation with increased jitter tolerance. The clock/data recovery circuit includes an oscillator that is locked to a target data rate prior to receiving a serial data burst. When the serial data burst arrives, a first data transition associated with the serial data burst causes issuance of a reset signal to initiate the burst operation mode. In one configuration, a phase of the oscillator is reset in response to the reset signal for achieving phase alignment or lock onto a first edge or transition of the burst of data to complete the burst operation mode. During a continuous operation mode, a phase tracking loop maintains a phase lock until the end of the serial data burst. In one configuration, the edge detection is disabled during the continuous operation mode.

In one aspect of the disclosure, the dual mode clock/data recovery circuit includes an edge detector circuit coupled to a differential input. The edge detector circuit detects receipt of a serial data burst and generates a reset signal in response to a first edge of the serial data burst. The dual mode clock/data recovery circuit also includes an oscillator (e.g., voltage controlled oscillator (VCO)) coupled to the edge detector circuit. The oscillator locks onto a target data rate prior to receipt of a serial data burst and locks onto a first edge of the serial data burst in response to the reset signal during a burst operation mode. The dual mode clock/data recovery circuit also includes phase detector circuit coupled to the differential input and the oscillator to provide a phase tracking loop as part of the continuous operation mode. The phase detector circuit adjusts the oscillator to maintain the lock onto a phase of the burst of the serial data during the burst of the serial data.

The dual mode clock/data recovery circuit can be implemented in a serial communication system of FIG. 1.

FIG. 1 is a block diagram illustrating a serial communication system 100, which transmits data bits sequentially over a communication channel 106. The serial communication system 100 includes a transmitter device 102, a receiver device 104, and a communication channel 106. The transmitter device 102 transmits data serially over the communication channel 106 without an accompanying clock signal, which may be embedded within the serial data. The data is transmitted or received in a continuous operation mode or in a burst operation mode. The receiver device 104 receives the serial data stream, recovers the serially transmitted data and extracts a clock timing from the received serial data stream, as described in detail below. The extracted clock signal may be used to generate a local clock signal that is aligned, with the incoming serial data. The transmitter device 102 and receiver device 104 may be part of a wide area network and implemented as integrated circuits located on a single circuit board, on separate circuit boards or on different blocks within a chip. The communication channel 106 may be a communication satellite link, a fiber optic cable, back plane connectivity, chip-to-chip interconnection or interconnectivity inside a chip. The transmitter device 102 and the receiver device are described in detail in FIG. 2.

Figure 2:
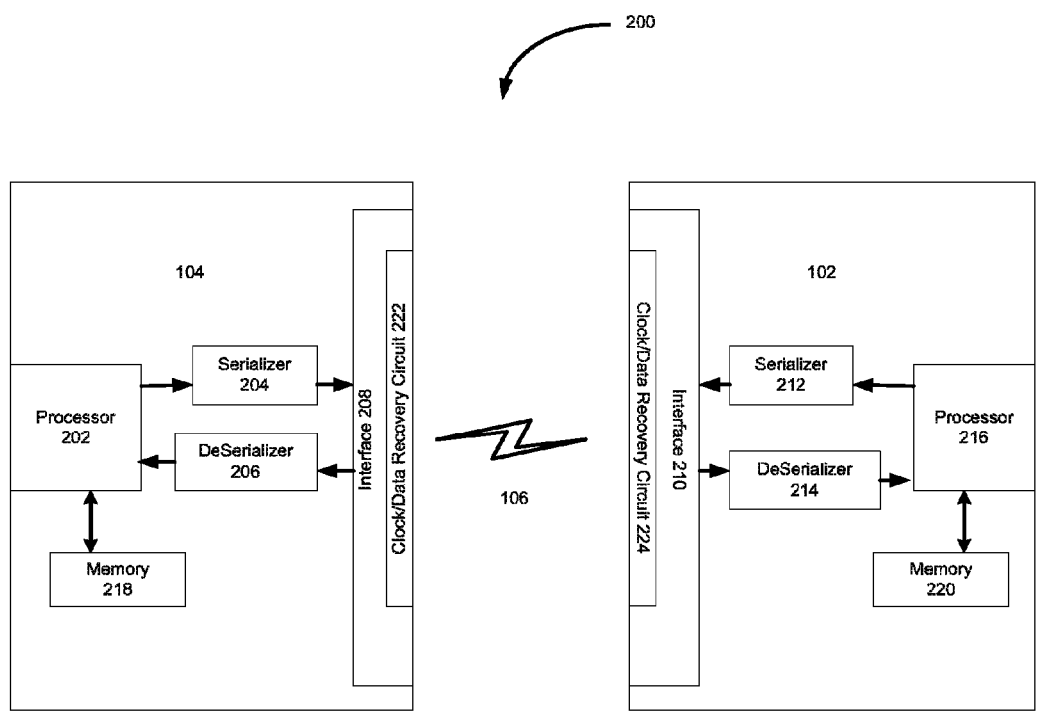
FIG. 2 is a block diagram illustrating a receiver device and a transmitter device for receiving and transmitting bit streams over a communication channel according to some aspects of the disclosure.

FIG. 2 is a block diagram illustrating a receiver device 104 and a transmitter device 102 for receiving and transmitting data over a communication channel 106 according to some aspects of the disclosure. The receiver device 104 and the transmitter device 102 include interfaces 208 and 210, respectively. In one aspect of the disclosure, the interfaces 208 and 210 are specified according to the M-PHY specification. The M-PHY interfaces 208 and 210 may be integrated into a single device (i.e., the receiver device 104 or the transmitter device 102). Alternatively, the M-PHY interfaces 208 and 210 may be independent but communicatively coupled to the receiver device 104 and/or the transmitter device 102, via a serial bus, interconnect or a communication channel.

The receiver device 104 and the transmitter device 102 may include dual mode (i.e., continuous or burst operation mode) clock/data recovery circuits 222 and 224, respectively. In one aspect of the disclosure, the dual mode clock/data recovery circuits 222 and 224 may be incorporated in the interfaces 208 and 210, respectively. Alternatively, the dual mode clock/data recovery circuits 222 and 224 may be independent but coupled to the interfaces 208 and 210, respectively.

The receiver device 104 includes a processor 202 in communication with a deserializer 206 and a serializer 204. Alternatively, the processor 202 can be independent but coupled to the receiver device 104. The processor 202 also stores data to and retrieves data from a memory 218. When data bits are received at the receiver device 104, the data bits are processed according to the M-PHY specifications at the interface 208. Similar to the receiver device 104, the transmitter device 102 also includes a processor 216 in communication with a deserializer 214 and a serializer 212. The processor 216 also stores data to and retrieves data from a memory 220. When a command from the processor 216 to retrieve data from the memory 220 is initiated, that data is serialized and transmitted via the M-PHY interface 210 to the receiver device 104 via the communication channel 106. Although the receiver device 104 and the transmitter device 102 are operable to receive and transmit data, respectively, the operation of the receiver device 104 and the transmitter device 102 are interchangeable.

Each data bit sent over the communication channel 106 is represented as a pulse of a predetermined time period of a high or low voltage level. Switching between the high and low voltage levels occurs in synchronization with a clock signal local to the transmitter device 102. The clock signal, however, is not separately transmitted to the receiver device 104. Thus, in order to recover data from a serial data stream, the receiver device 104 detects bit boundaries using clock and data recovery schemes associated with the dual mode clock/data recovery circuit 222, for example.

The proposed dual mode clock/data recovery circuit 222 or 224 supports burst operation mode communication which favors powering down a communication link between transmission bursts to reduce power consumption by reducing the overhead, time for starting and stopping transmission. The proposed dual mode clock/data recovery circuit 222 or 224 also supports continuous operation mode communication.

Figure 3:
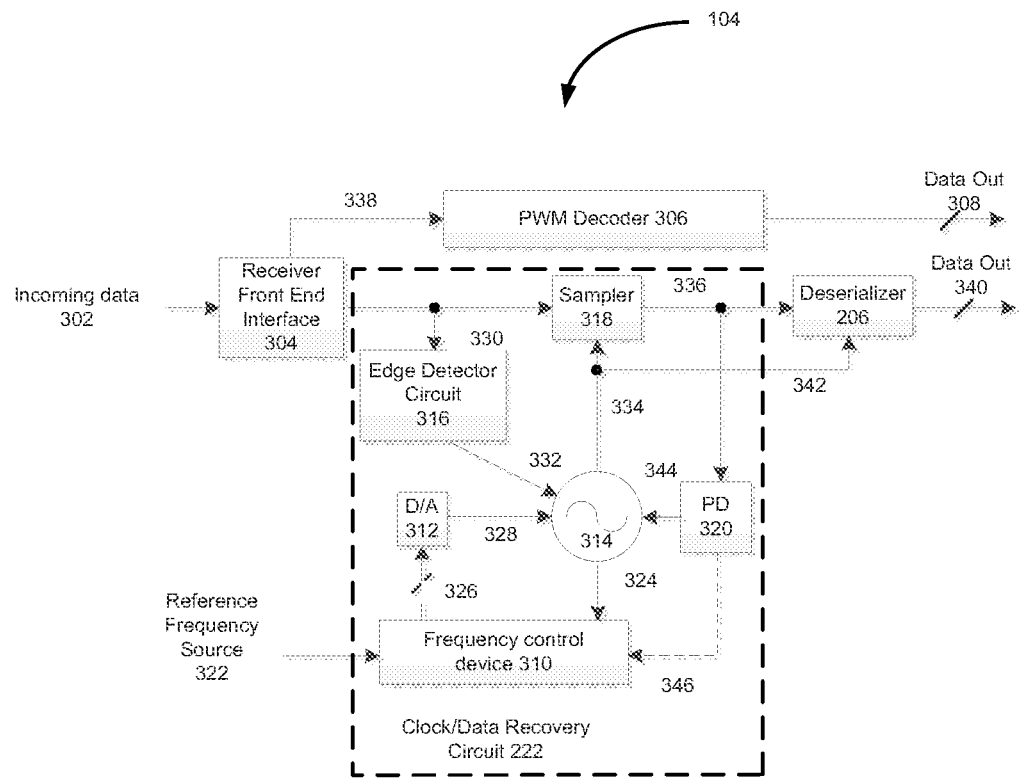
FIG. 3 illustrates a serial data communication receiver device including a dual mode clock/data recovery circuit according to some aspects of the disclosure.

FIG. 3 illustrates a serial data communication receiver device 104 including a dual mode clock/data recovery circuit 222 according to some aspects of the disclosure. The receiver device 104 includes a receiver front-end interface 304, a pulse-width-modulation (PWM) decoder 306, a deserializer 206 and a dual mode clock/data recovery circuit 222. The receiver front-end interface 304 is positioned at an input of the receiver device 104 to receive incoming data 302. The incoming data includes burst operation mode high frequency signals that are received at rates of, for example, 1.248, 1.4576, 2.496, or 2.9152 Gigabits per second (Gbps) and/or according to a specification for a PWM encoded data signal. The receiver front-end interface 304 may include an equalizer (not shown) and may be configured for analog signals. The PWM decoder 306 decodes a PWM encoded data signal 338 from the incoming data 302 and outputs a first data output signal 308. The deserializer 206 generates a second data output signal 340 based on a clock signal 342 from an oscillator 314 and an input signal 336 from the sampler 318.

In this configuration, the dual mode clock/data recovery circuit 222 includes a frequency control device 310 (e.g., a digital frequency control device), a digital to analog converter 312, the oscillator 314 (e.g., a voltage controlled oscillator (VCO)), an edge detector circuit 316, a sampler 318, and a phase detector (PD) circuit 320 (e.g., digital phase detector circuit). The proposed dual mode clock/data recovery circuit 222 implements an inner loop and an outer loop (or phase tracking loop). The inner loop includes the frequency control device 310, the digital to analog (D/A) converter 312 and the oscillator 314. In some aspects of the disclosure, the inner loop is a phase locked loop or a frequency locked loop. The outer loop includes the sampler 318, the oscillator 314 and the phase detector (PD) circuit 320.

During operation, the inner loop tunes the oscillator 314 to an initial target frequency (e.g., 2.9152 gigahertz (GHz)) by locking the oscillator 314 to the target frequency, which corresponds to a target data rate. The target data rate is a predetermined or known data rate of the incoming data 302 prior to receipt of the serial data. In some aspects of the disclosure, the oscillator 314 is a resettable voltage controlled oscillator that is frequency-locked to the target data rate prior to the serial data burst. The target frequency or target data rate is based on a reference frequency supplied by a frequency source 322. For example, the target frequency may be defined by the reference frequency (e.g., 19.2 MHz) multiplied by a factor (e.g., 151.833 for 2.9152 GHz). The frequency control device 310 provides a control signal 326 via the digital to analog converter 312 that is fed as an input signal 328 to the oscillator 314. An output signal 324 of the oscillator 314 that is received at the frequency control device 310 is controlled by and is frequency dependent on the control signal 326. As a result, the output signal 324 of the oscillator 314 may be controlled to be within a desired frequency band, for example, the target frequency, which is based on the reference frequency provided to the frequency control device 310. Therefore, the frequency control device 310 controls the output of the inner loop (e.g., phase lock loop or frequency lock loop) such that the frequency of the inner loop is locked to the target frequency.

The edge detector circuit 316 is coupled to the receiver front-end interface 304 and the oscillator 314. The edge detector circuit 316 receives a signal 330 of the serial data burst from an output of the receiver front-end interface 304. In some aspects, the signal 330 received by the edge detector is a differential signal. When the serial data burst or incoming data 302 is received, the edge detector circuit 316 detects a first edge of the signal 330 of the incoming data 302. The first edge corresponds to a first transition of the serial data burst from a high to a low or vice versa. The edge detector then generates a reset signal 332 based on the first detected edge to initiate a burst operation mode. The oscillator 314 resets in response to the reset signal 332 from the edge detector circuit 316, which allows the oscillator 314 to lock on to an initial phase of the incoming data 302. Thus, an edge timing corresponding to the first transition of the serial data burst facilitates a reset of the oscillator phase. In some aspects of the disclosure, the edge detector circuit 316 is disabled following the detection of the first edge of the serial data burst 302 to complete a burst operation mode. Disabling the edge detector circuit 316 conserves power to the dual mode clock/data recovery circuit 222. For example, the edge detector may be disabled by a switching implementation (e.g., a switch). Further, the inner loop or frequency loop may be disabled after the oscillator phase is reset to conserve power following the burst operation mode. Similarly, the inner loop may be disabled based on a switching implementation.

The outer loop (or phase tracking loop) includes the sampler 318, the phase detector (PD) circuit 320, and the oscillator 314. In this configuration, the phase tracking loop tracks a phase of the incoming data 302 and adjusts the oscillator 314 to maintain a lock onto the phase of the incoming data 302 until the incoming data terminates during the continuous operation mode. Thus, after the phase of the oscillator 314 is reset based on the first transition of the serial data burst, the outer loop maintains the phase alignment. Maintaining the phase alignment of the clock and the data or a lock on the serial data burst phase is supported by the phase detector circuit 320. The phase detector circuit 320 is configured to activate in response to detecting the first edge of the serial data burst. For example, the phase detector circuit 320 may be activated or disabled by a switching implementation (e.g., a switch). The sampler 318 receives a clock signal 334 from the oscillator 314 and the phase detector 320 receives an input signal 336 from the sampler 318. The sampler samples bits of the incoming data 302 with the clock signals 334 received from the oscillator 314. The phase detector 320 adjusts the oscillator 314 based on the phase of the input signal 336 received from the sampler 318 to maintain the lock onto the phase of the serial data burst 302. For example, a phase adjustment output signal 344 from the phase detector 320 directs the oscillator 314 to either speed up or slow down the clock to adjust the phase of the clock signals of the oscillator 314. Accordingly, the phase detector circuit 320 checks the alignment of the reference clock generated by the oscillator 314 to the incoming data 302.

In some aspects of the disclosure, a phase adjustment output signal 346 from the phase detector 320 enters the frequency control device 310 to either speed up or slow down the clock to adjust the phase of the clock signals of the oscillator 314. The phase adjustment output signal 346 facilitates implementation of a slow frequency tracking from the phase detector 320 to compensate for a slow frequency drift of the oscillator 314 during long data bursts or continuous operations. In some aspects of the disclosure, the outer phase tracking loop supports the continuous operation mode by maintaining a lock onto a phase of the incoming data.

In some aspects of the disclosure, the phase detector (PD) circuit 320 is a digital phase detector and can be programmed for producing desired functionality. For example, the phase detector circuit 320 can be programmed to reduce the outer loop gain to improve a high frequency jitter performance or it can be programmed to increase the outer loop gain to improve a low frequency jitter performance. Further, the gain of the outer loop can be programmed to adjust the bandwidth of the outer loop. In this configuration, the dual mode clock/data recovery circuits 222 or 224 consumes less current, improves jitter tolerance, and is smaller in size relative to conventional clock/data recovery implementations.

Figure 4:
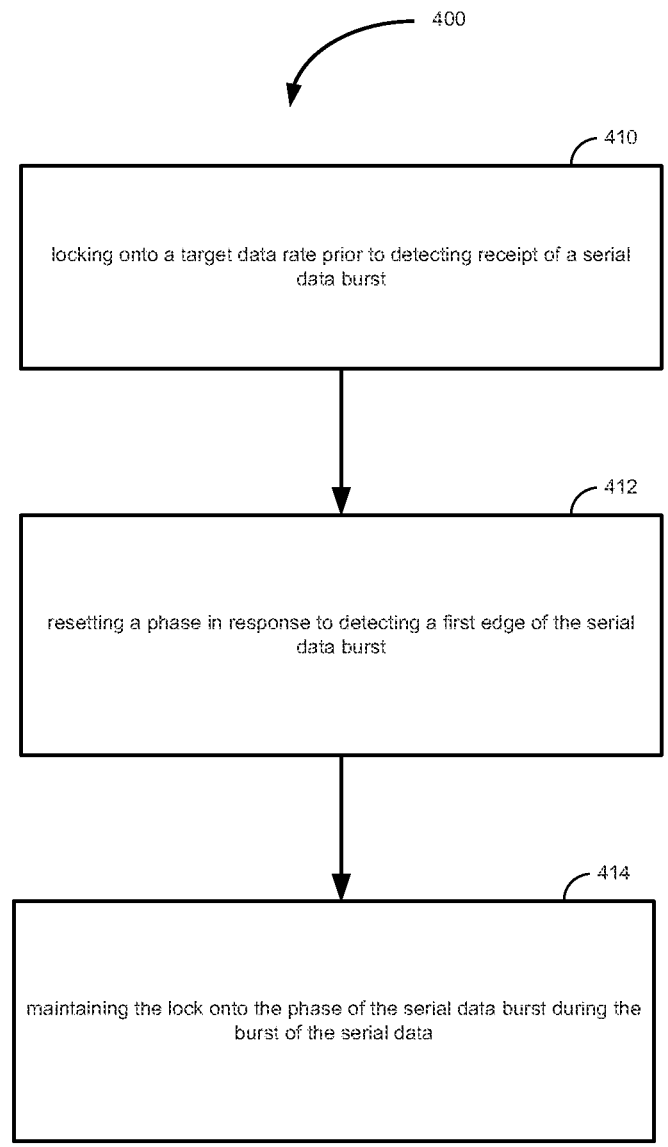
FIG. 4 illustrates a method for implementing a dual mode clock/data recovery technique according to an aspect of the present disclosure.

FIG. 4 illustrates a method 400 for implementing a dual mode clock/data recovery technique according to an aspect of the present disclosure. The method includes locking onto a target data rate prior to detecting receipt of a serial data burst at block 410. For example, as shown in FIG. 3, an output signal 324 of the oscillator 314 that is received at the frequency control device 310 is controlled by and is frequency dependent on the control signal 326. As a result, the output signal 324 of the oscillator 314 may be controlled to lock onto a desired frequency, for example, the target frequency or target data rate, which is based on the reference frequency provided to the frequency control device 310.

A reset signal is generated in response to detecting a first edge of the serial data burst. For example, as shown in FIG. 3, during operation the edge detector circuit 316 detects a first edge of the signal 330 of the incoming data 302 and generates a reset signal 332. At block 412, the method locks onto a phase of the serial data burst in response to the reset signal. For example, as shown in FIG. 3, the oscillator 314 resets in response to the reset signal 332 from the edge detector circuit 316, which allows the oscillator 314 to lock onto an initial phase of the incoming data 302.

At block 414, the method maintains the lock during the serial data, burst. For example, as shown in FIG. 3, maintaining the phase alignment of the clock and the data (i.e., a lock on the serial data burst phase) is achieved with the phase detector circuit 320.

Figure 5:
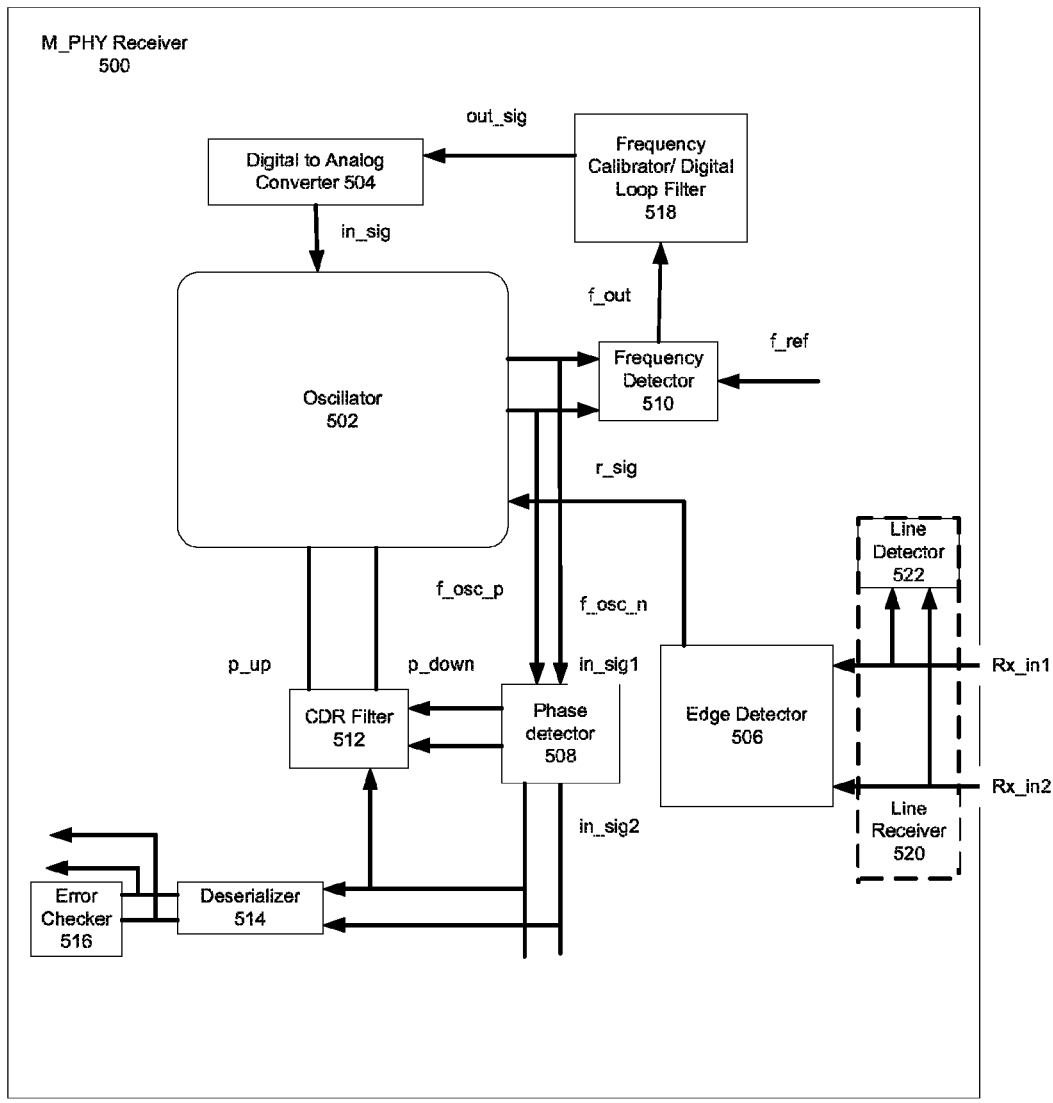
FIG. 5 illustrates a top-level block diagram of an example of a differential M-PHY receiver according to one aspect of the disclosure.

The present disclosure also operates with a differential input signal. FIG. 5 illustrates a top-level block diagram of an example of a differential M-PHY receiver 500 according to one aspect of the disclosure. The M-PHY receiver 500 includes a clock/data recovery implementation for sampling incoming data 302 and deriving an embedded clock signal from the incoming data 302 for sampling the incoming data 302. The M-PHY receiver 500 includes a line receiver 520 operably coupled to a differential receiver path Rx_in1 and Rx_in2, The M-PHY receiver 500 further includes an oscillator 502, a digital to analog converter 504, an edge detector 506, a phase detector 508, a frequency detector 510, a clock/data recovery (CDR) filter 512, a deserializer 514, and a frequency calibrator/digital loop filter 518. The M-PHY receiver 500 also includes an error checker 516 with error handling capabilities that receives an input signal from the deserializer 514. The deserializer 514 performs serial to parallel conversion of the data stream received by the M-PHY receiver 500. The line receiver 520 includes a line detector 522 that detects the incoming data.

The digital to analog converter 504, the frequency calibrator/digital loop filter 518, the frequency detector 510 and the oscillator 502 are arranged in an inner loop. As shown in FIG. 5, the inner loop tunes the oscillator 502 to an initial target frequency, (e.g., f_osc_p and/or f_osc_n) by locking the oscillator 502 to the target frequency. F_osc_p and f_osc_n are complimentary differential signals of opposite phases. The frequency detector 510 receives the reference signal f_ref and the initial target frequency and outputs an output signal f_out. For example, f_out is a digital signal (bus) representing the frequency ratio between the differential signals f_osc_p and f_osc_n and f_ref. In one aspect of the disclosure, the frequency ratio between the differential signals f_osc_p and f_osc_n and f_ref is programmable. The frequency detector 510 also receives the differential input signals f_osc_p and f_osc_n from the oscillator 502. The frequency detector 510 detects the ratio between the differential input signals f_osc_p and f_osc_n and the reference signal f_ref and outputs the digital signal (bus) representing the frequency ratio to the frequency calibrator/digital loop filter 518. The frequency calibrator/digital loop filter 518 compares the frequency ratio and a predetermined target frequency ratio, which defines the target frequency, for example, and outputs a signal, out_sig, to the digital to analog converter 504 that is fed as an input signal, in_sig, to the oscillator 502. The differential signals f_osc_p and f_osc_n from the oscillator 502 that are received at the frequency detector 510 are controlled by and are frequency dependent on the output signal, out_sig. As a result, the differential signals f_osc_p and f_osc_n from the oscillator 502 to the frequency detector 510 may be controlled to be within a desired frequency band (e.g., the target frequency), which is based on a reference frequency provided to the frequency detector 510.

The edge detector 506 is coupled to the line receiver 520 and the oscillator 502. The edge detector 506 receives differential signals Rx_in1 and Rx_in2 of the incoming data 302 from the line receiver 520. When the incoming data is received, the edge detector 506 detects a first edge of the signal Rx_in1 or Rx_in2 of the incoming data. The edge detector 506 then generates a reset signal, r_sig, based on the first detected edge to initiate a burst operation mode and forwards the reset signal, r_sig, to the oscillator 502. The oscillator 502 resets in response to the reset signal, r_sig, which allows the oscillator 502 to lock on to an initial phase of the incoming data. Thus, an edge timing corresponding to the first transition of the incoming data resets the oscillator phase.

The phase detector (PD) 508, including samplers, the CDR filter 512, and the oscillator are arranged in an outer loop. As shown in FIG. 5, the outer loop or phase tracking loop tracks a phase of the incoming data and adjusts the oscillator 502 to maintain a lock onto the incoming data phase until the incoming data terminates. Therefore, after the phase of the oscillator 502 is reset based on the first transition of the incoming data 302, the outer loop maintains the phase alignment.

In operation, differential incoming signals in_sig1 and in_sig2 of the incoming data 302 are provided to an input of the phase detector 508. Maintaining the phase alignment of the clock and the data or a lock on the incoming data phase is achieved with the phase detector 508. The phase detector 508 receives differential clock signals f_osc_p and f_osc_n from the oscillator 502. The phase detector 508 samples bits of the incoming data with the differential clock signals f_osc_p and f_osc_n from the oscillator 502. The output of the phase detector 508 is directed to an input of the CDR filter 512. The output of the CDR filter 512 provides a signal phase up (p_up) and phase down (p_down), which indicates whether the oscillator clock is speeded up or slowed down. The signals p_up and p_down are provided to the oscillator 502. The signals p_up and p_down are a measure of the output of the phase detector 508 and are proportional to the differential incoming signals in_sig1 and in_sig2 when the outer loop is locked, for example. The phase detector 508 includes samplers having outputs that are fed to the deserializer 514. The outputs of the phase detector are used for a phase error implementation by feeding the outputs into the CDR filter 512 to further adjust the phase of the oscillator 502.

In one configuration, the apparatus includes means for locking onto a target data rate prior to receipt of the serial data burst. In one aspect of the disclosure, the target data rate locking means may be the digital to analog converter 312, the digital to analog converter 504, the oscillator 314, the oscillator 502, the frequency control device 310, the frequency detector 510, the frequency calibrator/digital loop filter 518, and/or the reference frequency source 322 configured to perform the functions recited by the target data rate locking means as shown in FIGS. 3 and 5. The apparatus may also include means for detecting a first edge of the serial data burst. In one aspect of the disclosure, the edge detecting means may be the edge detector circuit 316 and/or the edge detector 506 configured to perform the functions recited by the edge detecting means. In another aspect, the aforementioned means may be any device configured to perform the functions recited by the aforementioned means.

The apparatus may also include means for locking onto a phase of the serial data burst in response to the detecting. In one aspect of the disclosure, the phase locking means may be the edge detector circuit 316, the edge detector 506, the oscillator 314, the oscillator 502, the line receiver 520 and/or the receiver front end interface 304 configured to perform the functions recited by the phase locking means. The apparatus may also include means for maintaining the lock onto the phase of the serial data burst during the serial data burst. In one aspect of the disclosure, the maintaining means may be the phase detector circuit 320, the phase detector 508, the oscillator 314, the oscillator 502, the CDR filter 512 and/or the sampler 318 configured to perform the functions recited by the phase locking means. In another aspect, the aforementioned means may be any device configured to perform the functions recited by the aforementioned means.

Figure 6:
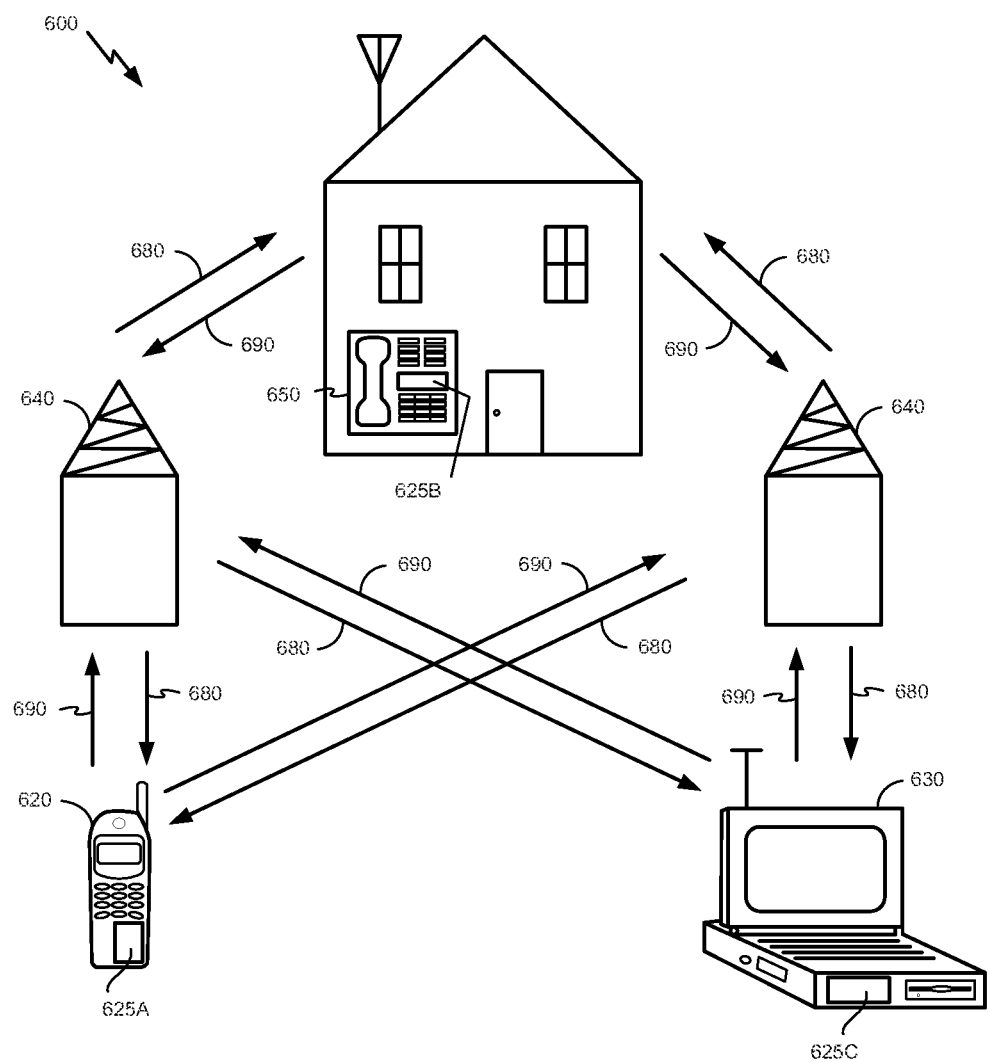
FIG. 6 shows an exemplary wireless communication system in which an embodiment of the disclosure may be advantageously employed.

FIG. 6 shows an exemplary wireless communication system in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include clock/driver recovery circuits 625A, 625B, 625C. FIG. 6 shows forward link signals 680 from the base stations 640 and the remote units 620, 630, and 650 and reverse link signals 690 from the remote units 620, 630, and 650 to base stations 640.

In FIG. 6, the remote unit 620 is shown as a mobile telephone, remote unit 630 is shown as a portable computer, and remote unit 650 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 6 illustrates remote units, which may employ the clock/driver recovery circuits 625A, 625B, 625C according to the teachings of the disclosure, the disclosure is not limited to these exemplary illustrated units. For instance, a clock/driver recovery circuit according to embodiments of the present disclosure may be suitably employed in any device.

Figure 7:
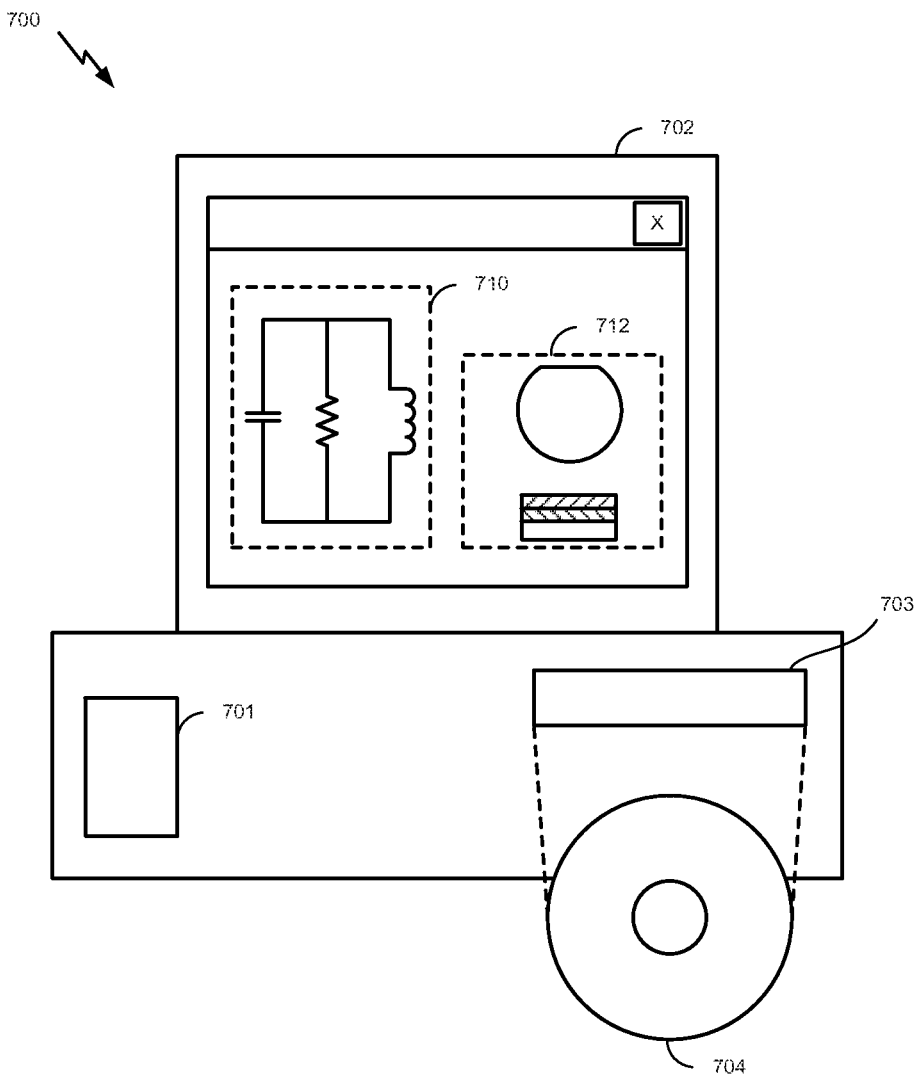
FIG. 7 is a block diagram illustrating a design workstation used for circuit, layout, and logic design of a semiconductor component according to one aspect of the present disclosure.

FIG. 7 is a block diagram illustrating a design workstation used for circuit, layout, and logic design of a semiconductor component, such as the clock/driver recovery circuit disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a clock/driver recovery circuit. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A clock/data recovery circuit, comprising:
   an edge detector circuit operable to receive a serial data burst and to generate a reset signal in response to a first edge of the serial data burst;
   an oscillator coupled to the edge detector circuit, the oscillator being operable to lock onto a target data rate prior to receipt of the serial data burst and to lock onto a phase of the serial data burst in response to the reset signal; and
   a phase detector circuit operable to receive the serial data burst and also coupled to the oscillator, the phase detector circuit operable to adjust the oscillator to maintain the lock onto the phase of the serial data burst during the serial data burst.

2. The clock/data recovery circuit of claim 1, further comprising a loop filter coupled to the phase detector circuit and the oscillator, the loop filter operable to track the phase of the serial data burst.

3. The clock/data recovery circuit of claim 1, in which the oscillator, the phase detector circuit, and a loop filter form a phase tracking loop of the clock/data recovery circuit operable to maintain the lock onto the phase of the serial data burst until the serial data burst terminates.

4. The clock/data recovery circuit of claim 1, in which the phase detector circuit is configured to activate in response to detecting the first edge of the serial data burst.

5. The clock/data recovery circuit of claim 4, in which the phase detector circuit is configured to disable after detecting the first edge of the serial data burst.

6. The clock/data recovery circuit of claim 1, further comprising control logic coupled to the phase detector circuit and the oscillator, the control logic operable to enable the oscillator to lock onto the target data rate prior to receipt of the serial data burst.

7. The clock/data recovery circuit of claim 1, in which the clock/data recovery circuit is integrated into at least one of a cell phone, a portable computer, a hand-held personal communication systems (PCS) unit, a portable data unit, a personal data assistant and a fixed location data unit.

8. A method within a clock/data recovery circuit, comprising:
   locking onto a target data rate prior to detecting receipt of a serial data burst;
   resetting a phase in response to detecting a first edge of the serial data burst; and
   maintaining the lock onto the phase of the serial data burst during the burst of the serial data.

9. The method of claim 8, further comprising tracking the phase of the serial data burst to enable the maintaining.

10. The method of claim 8, further comprising activating a phase detector circuit in response to detecting the first edge of the serial data burst.

11. The method of claim 10, further comprising disabling the phase detector circuit subsequent to detecting the first edge of the serial data burst.

12. The method of claim 8, further comprising integrating the clock/data recovery circuit into at least one of a cell phone, a portable computer, a hand-held personal communication systems (PCS) unit, a portable data unit, a personal data assistant and a fixed location data unit.

13. A clock/data recovery circuit, comprising:
   means for locking onto a target data rate prior to receipt of a serial data burst;
   means for detecting a first edge of the serial data burst;
   means for locking onto a phase of the serial data burst in response to the detecting; and
   means for maintaining the lock onto the phase of the serial data burst during the serial data burst.

14. The clock/data recovery circuit of claim 13, in which the maintaining means further comprises means for tracking the phase of the serial data burst.

15. The clock/data recovery circuit of claim 13, further comprising means for activating a phase detector circuit in response to detecting the first edge of the serial data burst.

16. The clock data recovery circuit of claim 15, further comprising means for disabling the phase detector circuit subsequent to detecting the first edge of the serial data burst.

17. The clock data recovery circuit of claim 13, in which the clock/data recovery circuit is integrated into at least one of a cell phone, a portable computer, a hand-held personal communication systems (PCS) unit, a portable data unit, a personal data assistant and a fixed location data unit.

18. A method within a clock/data recovery circuit, comprising:
   the step for locking onto a target data rate prior to detecting receipt of a serial data burst;
   the step for resetting a phase in response to detecting a first edge of the serial data burst; and
   the step for maintaining the lock onto the phase of the serial data burst during the burst of the serial data.

19. The method of claim 18, further comprising the step for tracking the phase of the serial data burst to enable the maintaining.

20. The method of claim 18, further comprising the step for integrating the clock/data recovery circuit into at least one of a cell phone, a portable computer, a hand-held personal communication systems (PCS) unit, a portable data unit, a personal data assistant and a fixed location data unit.

\* \* \* \* \*